United States Patent [19]

Rogers

[11] Patent Number: 5,061,864
[45] Date of Patent: Oct. 29, 1991

[54] MONOPHASE LOGIC

[75] Inventor: Alan C. Rogers, South Portland, Me.

[73] Assignee: National Semiconductor Corporation, Santa Clara, Calif.

[21] Appl. No.: 540,214

[22] Filed: Jun. 18, 1990

[51] Int. Cl.$^5$ ............... H03K 19/003; H03K 19/017; H03K 17/04; H03K 17/687

[52] U.S. Cl. .................................. 307/443; 307/542; 307/451; 307/550; 307/548; 307/448; 307/449

[58] Field of Search ............... 307/448, 450, 451, 481, 307/572-575, 585, 443, 542, 449

[56] References Cited

U.S. PATENT DOCUMENTS

| | | | |
|---|---|---|---|
| 4,885,485 | 12/1989 | Leake et al. | 307/443 X |
| 4,959,561 | 9/1990 | McDermott et al. | 307/443 |
| 4,959,565 | 9/1990 | Knecht et al. | 307/443 X |
| 4,977,341 | 12/1990 | Stein | 307/443 X |
| 4,985,643 | 1/1991 | Proebsting | 307/443 |
| 4,992,676 | 2/1991 | Gerosa et al. | 307/443 |

OTHER PUBLICATIONS

Zhang, "An Improvement For Domino CMOS Logic", 1987 CEE, pp. 53-59.
Oklobdzija et al., ". . . CMOS Domino Logic", 1985 IEEE CICC, pp. 334-337.
Pretorius et al., "Latched Domino CMOS Logic", 1986 IEEE JSSC, pp. 514-522.
Krambeck et al., "High Speed Compact Circuits with CMOS", 1982 IEEE JSSC, pp. 614-619.

Primary Examiner—Stanley D. Miller
Assistant Examiner—David R. Bertelson
Attorney, Agent, or Firm—James W. Rose; Daniel H. Kane

[57] ABSTRACT

Intermediate path splitting circuit arrangements are coupled between the input node and output stage of an IC defining a plurality of different signal propagation paths. A relatively higher speed output pullup turn on signal progagation path is coupled between the input node and the output pullup transistor element for turning on the output pullup transistor element at relatively higher speed in response to a first input data signal. A relatively slower speed output pulldown turn off signal propagation path turns off the output pulldown transistor element at a relatively slower speed in response to the first data input signal. Similar circuit arrangements are provided for relatively high speed turn on of the pulldown transistor element and relatively low speed turn off of the pullup transistor element. Control of turn on and turn off of the respective output pullup and pulldown transistor elements is from separate output driver nodes for higher speed operation. The separate split paths are provided by sequences of internal stages with skewed conductance pullup and pulldown elements. A cutoff circuit cuts off the output pullup and pulldown transistor elements a time delay after transmission of an output data signal to reduce simultaneous conduction. A data saver circuit coupled to the final output node saves the output data signal during cutoff. The high speed on logic signal propagation circuits are applicable in CMOS circuits and other logic families.

30 Claims, 5 Drawing Sheets

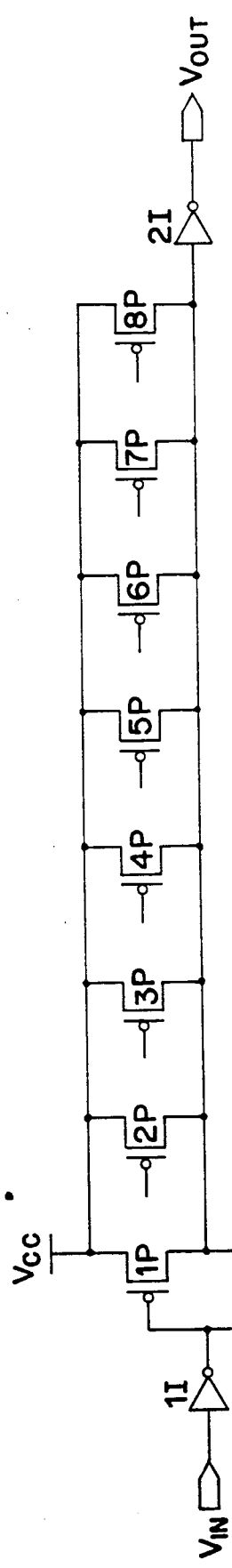
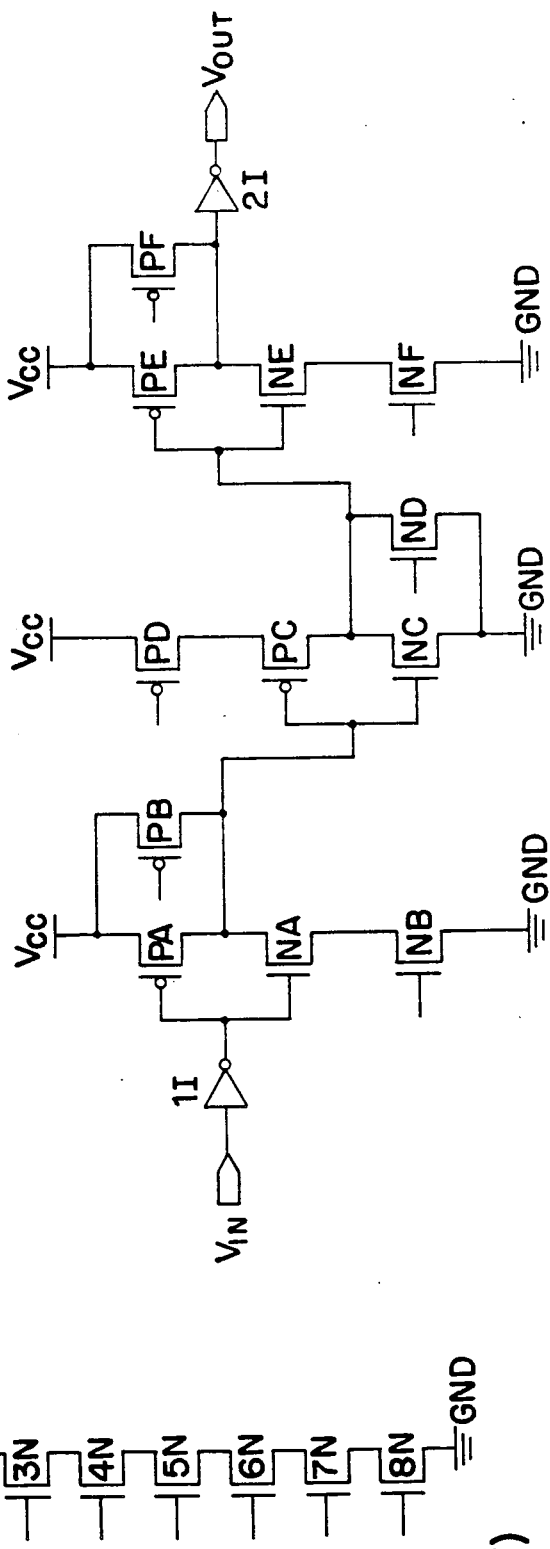
FIG 9 (PRIOR ART)
FIG 10 (PRIOR ART)

MONOPHASE LOGIC

CROSS REFERENCE TO RELATED PATENT APPLICATION

This invention is related to applicant's co-pending U.S. patent application Ser. No. 508,283 filed Apr. 9, 1990 entitled TTL TO CMOS TRANSLATING CIRCUITS WITHOUT STATIC CURRENT, and assigned to the same assignee. In this co-pending earlier filed patent application, Applicant first disclosed without claiming certain elements of the present invention relating to the split path high speed monostate or monophase MOS integrated circuits.

TECHNICAL FIELD

This invention relates to high speed integrated circuits for transmitting data signals of high and low potential from an input node through intermediate circuit stages and an output stage to a final output node. The invention increases the speed of signal propagation to the final output node and is applicable for example in multi-stage buffer circuits, chain amplifier circuits, logic gates, complex logic function circuits, and IC system circuits generally. The invention is particularly suitable for complementary MOS (CMOS) integrated circuits.

BACKGROUND ART

A conventional CMOS four stage buffer circuit or chain amplifier with a sequence of four invertor stages is illustrated in FIGS. 1 & 2. An input data signal at the input node $V_{in}$ propagates through the successive CMOS invertor stages to the final output node $V_{out}$. The logic value of the data input signal, either a logic high or low potential level, is inverted at each stage. Because of the even number of stages, the data output signal appears at the final output node $V_{out}$ with the same logic value as the data input signal after a conventional signal propagation delay.

Each of the stages of the buffer circuit consists of a PMOS pullup transistor element coupled to the high potential power rail $V_{cc}$, an NMOS pulldown transistor element coupled to the low potential power rail GND, and an internal output node between the pullup and pulldown transistor elements. For example the first internal stage I1 which provides an input stage for the buffer circuit consists of a PMOS pullup transistor element P1, an NMOS pulldown transistor element N1, and the single internal output node A. The respective pullup and pulldown transistor elements provide sourcing and sinking current paths in a channel between source and drain leads. The control gate leads from the transistor elements P1,N1 of the first stage I1 are coupled to the input node $V_{in}$.

The second internal invertor stage I2 consists of pullup transistor element P2, pulldown transistor element N2 and a single internal output node B. The internal output node A of the previous stage I1 is coupled to the control gate leads of the pullup and pulldown transistor elements P2,N2 of the next stage I2, etc. The output stage is provided by pullup and pulldown transistor elements P4, N4 and output node D which in turn provides the final output node $V_{out}$.

Typical channel width values in microns ($\mu$) for the PMOS and NMOS transistor elements of the successive stages of the buffer chain amplifier circuit of FIGS. 1 & 2 are set forth in TABLE I. Current carrying capacity or current drive of the respective PMOS or NMOS transistor elements is proportional to channel width. It is apparent that greater channel width is provided for each successive stage of amplification. Because of the different characteristics of PMOS transistor elements from NMOS transistor elements in CMOS integrated circuits, a PMOS channel width approximately 2 to 3 times greater than the respective NMOS channel width in a stage is required for substantially equal current carrying capacity or current drive in the PMOS and NMOS transistor elements of a respective stage. This proportionality ratio is maintained as channel widths are increased through the successive stages of amplification of the buffer circuit.

TABLE I

CHANNEL WIDTHS ($\mu$)
FIGS 1 & 2
(PRIOR ART)

| | |
|---|---|
| P1 | 25 |
| N1 | 10 |
| P2 | 100 |
| N2 | 40 |
| P3 | 400 |
| N3 | 160 |
| P4 | 1600 |
| N4 | 640 |

A disadvantage of the conventional multi-stage CMOS buffer circuit of FIGS. 1 & 2 is that the energy or current drive of an intermediate output signal at one of the internal output nodes is substantially equally divided between the control gate leads of the pullup and pulldown transistor elements of the next stage. For example an intermediate output signal at the internal output node B from the second stage I2 is coupled to the control gate nodes of pullup and pulldown transistor elements P3, N3 of the third stage I3. Because transistor elements P3 and N3 have substantially equal current carrying capacity and current drive through the respective current paths or channels, the energy from the signal at internal output node B is substantially equally divided between the gates of P3 and N3. At the final output stage the signal from single internal output node C is substantially equally divided between the gates of the final output pullup and pulldown transistor elements P4 and N4. In fact, the energy of the signal at each internal output node must turn off one of the next stage pullup and pulldown transistor elements at the same time as it turns on the other. This division of energy of each of the internal propagating signals at each of the internal output nodes results in a substantial propagation time and signal propagation delay during switching of logic signals at the output.

It is noted that the propagating signals at the input node and at each of the internal output nodes A,B and C is constrained to turn on and turn off at the same time, pullup and pulldown transistor elements of substantially equal current drive. Because of this characteristic of performing substantially equal turn on and turn off functions at the same time, the internal propagating signals at nodes A,B and C of the conventional CMOS buffer circuit of FIGS. 1 & 2 are referred to herein as biphase or bistate signals. The internal output nodes such as A,B, & C are referred to herein as bistate or biphase nodes. Furthermore the circuit path through the sequence of stages and sequence of internal nodes of the conventional CMOS buffer circuit is also referred to herein as a biphase or bistate circuit path. Thus, by this "bistate" or "biphase" terminology it is intended to mean that the conventional signal propagation current path, the conventional internal nodes, and conventional internal propagating signal are required to implement simultaneous turn on and turn off of pullup and pulldown transistor elements with substantially equal division of the signal energy and current drive. Signal propagation delay accompanies this conventional bistate or biphase CMOS circuit configuration.

The biphase or bistate primary signal propagation current path is also referred to herein as an "on/off logic" circuit with an "on/off logic" signal. Insofar as the signal energy or signal current drive is allocated substantially equally for turn on of one of the pullup and pulldown transistor elements and turn off of the other, the same circuit path, the same internal nodes, and the same internal propagating signal are responsible for both the "on logic" and the "off logic" at the same time. It is this biphase allocation of the primary propagating signal energy at each internal output node that is responsible for approximately 50% of the conventional signal propagation delay in CMOS multi-stage buffer circuits.

In U.S. patent application Ser. No. 210,969 filed June 24, 1988, Robert J. Proebsting describes a "Speed Enhancement Technique for CMOS Circuits" composed of cascaded invertor stages for pulse signal propagation rather than binary level signal propagation. According to Proebsting the channel widths (and therefore current carrying capacities or conductances) of CMOS transistor elements in the successive stages are weighted or selected to favor high speed forward propagation of a signal to turn on one of the final output pullup or pulldown transistor elements. This signal is, for example, a positive going edge of a pulse for a clock pulse signal or other pulse signal. Without more, the circuit sacrifices forward propagation of a signal for turning on the other of the final output pullup or pulldown transistor elements. For example the circuit sacrifices forward propagation of a negative going edge to complete the pulse.

This is accomplished initially by favoring with large channel widths the turn on transistor elements (which might be viewed as one forward propagating signal path of "on logic" transistor elements) for turn on of only one of the final output pullup and pulldown transistor elements. The Proebsting circuit sacrifices those turn on transistor elements for the other of the output pullup or pulldown transistors elements (which might have been viewed as another forward propagating signal path for turn on of the other of the final output pullup and pulldown transistor elements) with disproportionately small channel widths.

Proebsting in effect provides a single "monophase" signal propagation path, for example for higher speed turn on for only one of the selected final output pullup or pulldown transistor elements and high speed signal propagation of, for example, the positive going edge for the pulse. The circuit might therefore be viewed effectively as a single "on logic" current path circuit for enhanced signal propagation speed of only one type of logic signal. The Proebsting circuit accommodates only a single phase input signal, e.g. for generating the positive going edge for the pulse. The internal output nodes of the Proebsting cascaded stages are effectively monophase nodes in the forward propagating signal direction. However as hereafter described, they are used for generating and propagating pulses rather than binary logic levels.

After a delay period the Proebsting circuit provides rapid switching or reset of the transistor elements in the sacrificed forward signal propagation current path for the negative going edge of the pulse using feedback from later stages. This is accomplished by providing two parallel source and drain MOS transistors for each reset transistor element of a stage. This parallel transistor pair consists of a small channel width transistor element driven by the forward propagating single phase input signal and a large channel width transistor element driven after a delay by a feedback signal of opposite phase from a later stage with greater current carrying and current drive capacity.

Thus, the Proebsting circuit provides enhanced forward signal propagation speed for only a single selected binary phase or binary logic signal which is actually the positive going edge for a pulse (but which might be viewed as a binary one or logic high level signal at the final output node). Signal propagation of the negative going edge to complete the pulse (which might be viewed as a binary zero or logic low level signal at the output) is sacrificed in the forward signal propagation direction from the input. The negative going transition is actually generated by the feedback signals from later stages controlling earlier stages.

It is noted that in the Proebsting circuit, a single output driver node drives both the final output pullup and pulldown transistor elements. Thus, even though a "monophase" or "monostate" forward signal propagation path is provided favoring a single logic phase or mode (i.e., the positive going edge) in the forward signal propagation direction, the output driver stage is required to switch final output pullup and pulldown transistor elements of substantially equal conductance and current capacity from a single output driver node. This single output driver node must still do the work of charging and discharging two large transistor elements with accompanying delay.

The Proebsting circuit is therefore an enhanced speed circuit for one side only or one monophase logic signal only (e.g. the positive going edge). The Proebsting circuit is incapable of providing enhanced speed signal propagation in the forward signal propagation direction for both logic high potential level and logic low potential level binary logic signals. As a single monophase forward signal propagating circuit it is dedicated to pulse signal propagation only. The present invention on the other hand is directed to high speed and enhanced speed forward signal propagation of both high and low potential level binary logic signals in multi-stage buffer circuits, amplifier circuits, logic gates and logic function and system circuits generally.

So called "domino" CMOS logic circuits are also discussed in the Proebsting U.S. Patent Application and may be of interest to the examination of this patent application. However neither the principles of Proebsting nor the principles, structure and function of the present invention are found in the domino logic CMOS circuits.

OBJECTS OF THE INVENTION

It is therefore an object of the present invention to provide new integrated circuits for transmitting data signals of both binary logic high and low potential levels from an input node through intermediate circuit stages and an output stage to a final output node with increased speed of signal propagation to the final output node.

Another object of the invention is to provide high speed IC's with intermediate path splitting circuits defining a plurality of different forward signal propagation paths for dividing or splitting the conventional bistate logic forward signal propagation circuit path and internal nodes, and conventional biphase propagating logic signal, into separate substantially monostate logic forward signal propagation circuit paths and nodes, and separate substantially monophase forward propagating logic signals.

According to the invention it is an objective to provide new high speed substantially monostate logic signal forward propagation circuit paths and nodes and relatively high speed substantially monophase forward propagating logic signals performing an "on logic" function only. That is, each monostate on logic circuit path and corresponding nodes, and each monophase on logic signal perform only the function of turning on one of the output pullup or pulldown transistor elements. Substantially all of the energy and all of the current drive of the monophase on logic propagating signal at an internal output node in each of the split paths is allocated for turning on one output transistor element only.

A further object of the invention is therefore to provide split monostate on logic signal propagation circuit paths in which substantially all of the signal energy and current drive of a monophase logic signal at an internal output node is allocated for turning on one of output pullup or pulldown transistor elements without allocation of substantial energy for turning off the complementary output transistor element. By this expedient the speed of signal propagation of binary high and low potential level logic signals from the IC input node to the final output node through successive stages is substantially increased. The "off logic" function of turning off the complementary output transistor element is achieved by allocating a separate relatively slower speed monostate signal propagation circuit path and relatively lower energy and lower current drive monophase "off logic" signal for turning off the complementary output transistor element.

Yet another object of the invention is to provide IC circuits such as multistage buffer circuits, amplifier circuits and logic circuits with split monostate signal propagation circuit paths and nodes and substantially monophase logic propagating signals for separate control of output pullup and pulldown transistor elements and in particular the final output pullup and pulldown transistor elements. At the same time, the invention minimizes crowbar current or contention current during separate switching of the output pullup and pulldown transistor elements. According to the invention the output pullup and pulldown transistor elements are cutoff, turned off or effectively held in a "tristate mode" after transmission of an output data signal to the final output node. Power dissipation is reduced while saving the output data signal at the final output node during cutoff of the pullup and pulldown transistor elements.

The invention also seeks to provide new IC multistage buffer circuits, amplifier circuits, logic circuits and MOS IC system circuits generally with separate or split monophase logic signal propagation circuit paths and nodes for separate processing of the split path monophase propagating binary high and low potential level logic signals. For example the split paths may incorporate different numbers of stages and logic functions in the different on logic and off logic paths for implementing more complex logic function circuits.

DISCLOSURE OF THE INVENTION

In order to accomplish these results the invention provides an intermediate path splitting circuit coupled between the input node and output stage of an MOS IC defining a plurality of different signal propagation paths in the forward signal propagation direction. A relatively higher speed output pullup turn on signal propagation path is coupled between the input node and the output pullup transistor element for turning on the output pullup transistor element at relatively higher speed in response to a first binary high or low potential level input data signal at the input node. A separate relatively slower speed output pulldown turn off signal propagation path is coupled between the input node and output pulldown transistor element for turning off the output pulldown transistor element at a relatively slower speed in response to said first input data signal.

By this arrangement a separate monophase on logic signal is provided in a high speed monostate on logic circuit path whose only function is to turn on active transistor elements in the monostate on logic circuit path and to turn on the output pullup transistor element from a monophase internal output node. All of the monophase on logic signal energy at selected internal output nodes is allocated to the function of turning on the pullup transistor element without also having to turn off the output pulldown transistor element. A separate slower speed monophase off logic signal path utilizes only a minor portion of the signal energy at internal output nodes for turning off the output pulldown transistor element at a slower rate.

Similarly a relatively higher speed output pulldown turn on signal propagation path is coupled between the input node and output pulldown transistor element for turning on the output pulldown transistor element at relatively higher speed in response to a second binary high or low potential level input data signal at the input node. A relatively slower speed output pullup turn off signal propagation path is coupled between the input node and output pullup transistor element for turning off the output pullup transistor element at relatively slower speed in response to said second data input signal.

By this arrangement another monophase on logic signal in a separate monostate on logic circuit path is provided whose only function is to turn on the output pulldown transistor element. Substantially all of the monophase on logic signal energy and current drive at selected internal output nodes of the second on logic circuit path are allocated for turn on of the output pulldown transistor element without having to turn off the output pullup transistor element. Only a minor portion of the propagation signal energy at internal output nodes is allocated for turn off of the output pullup transistor element in a separate relatively slow speed monophase off logic signal propagation current path. As a result separate relatively higher speed and slower speed signal propagation paths with separate monophase drive nodes are provided for separate control of turn on and turn off of the respective output pullup and pulldown transistor elements. Significant increase in signal propagation speed and reduction in signal propagation delay by as much as 50% is achieved by this arrangement.

In the preferred circuit embodiment the separate paths or split paths of the intermediate path splitting circuit include a plurality of internal stages each having a pullup transistor element, pulldown transistor element and an internal output node between the pullup and pulldown transistor elements. The pullup and pulldown transistor elements have a sourcing or sinking current path in a channel between source and drain nodes and a third control gate node for controlling the conducting state of the channel. The internal stages are arranged as follows.

A first sequence of output pullup control internal stages is coupled at one end to the input node and includes an output pullup driver stage having a substantially monophase driver output node coupled to the control gate node of the final output pullup transistor element and not the final output pulldown transistor element. A second sequence of output pulldown control internal stages is coupled at one end to the input node and includes an output pulldown driver stage having a substantially monophase driver output node coupled to the control gate node of the final output pulldown transistor element and not the final output pullup transistor element.

The first and second sequences are formed by internal stages with respective pullup and pulldown transistor elements having current carrying capacities or conductances, and in the case of MOS transistor elements, channel widths, in skewed ratios selected to provide substantially greater current drive through the monophase on logic sourcing and sinking current paths for turning on the respective output pullup or pulldown transistor element. The skewed ratio current carrying capacities or conductances, and in the case of MOS transistor elements, channel widths, afford substantially less current drive through the monophase off logic sourcing and sinking current paths for turning off the respective complementary output pullup or pulldown transistor element.

As used herein the phrases monostate or monophase on logic signal and signal propagation circuit path are used herein to denote a split circuit path and signal most of whose energy and current drive are allocated for turning on an output transistor element only. It is this current path which is formed by active transistor elements with relatively large current carrying capacities and in the case of MOS transistor elements relatively large channel widths providing greater current drive, higher speed signal propagation, and faster turn on of the respective output pullup or pulldown transistor element.

Similarly the phrases monostate or monophase off logic signal and signal propagation path are used herein to designate a split circuit path and signal whose energy and current drive is allocated for turning off a complementary output transistor element only. It is this monophase off logic current path that incorporates the active transistor elements with relatively small current carrying capacities and in the case of MOS transistor elements relatively small channel widths for allocating only a minor portion of signal energy and current drive for relatively slow speed signal propagation and for slower turn off of the respective output transistor element.

The phrase "skewed ratio" is used herein to refer to a ratio of current carrying capacities or conductances and in the case of MOS transistor elements to a ratio of channel widths of complementary pullup and pulldown transistor elements of an internal stage which departs substantially from a conventional ratio of current carrying capacities, conductances, or channel widths yielding substantially equal current carrying capacity or current drive through the pullup and pulldown transistor elements. As used herein "skewed ratios" as to MOS transistor elements generally refer to ratios of MOS transistor channel width sizes in an internal stage producing respective current carrying capacities and current drives that are substantially unequal. Thus, the ratio of MOS channel widths of complementary transistor elements in the internal stages of the split path buffer circuits according to the invention may be in the range of at least 3 times the conventional ratios that produce substantially equal current carrying capacity or equal conductance. In the preferred form of the invention the skewed ratios are in the order of approximately 5 times conventional channel width size ratios or greater.

The invention also provides circuit arrangements for substantially avoiding or reducing the crowbar current or contention current through the output pullup and pulldown transistor elements that may result from separate control of the output pullup and pulldown transistor element through the separate split monophase signal propagation current paths and separate monophase internal output nodes. A prolonged period of simultaneous conduction may occur following high speed turn on of one of the pullup or pulldown transistor elements during the relatively slow speed and prolonged turn off of the complementary output transistor element. Accordingly the invention provides a cutoff circuit arrangement for cutting off the output pullup and pulldown transistor elements from the respective high and low potential power rails after transmission of an output data signal at the final output node. A data saver circuit coupled to the final output node saves the output data signal during cutoff of the output pullup and pulldown transistor elements.

In the preferred example embodiment, a negative feedback circuit is coupled between the final output node and the respective first and second sequences of internal stages. The negative feedback circuit turns off the respective output pullup or pulldown transistor element after a feedback coupling circuit time delay following propagation of a data input signal to the final output node. The negative feedback circuit incorporates a data saver circuit such as a latch circuit coupled to the final output node for saving the output data signal after turn off of the output pullup and pulldown transistor elements.

To implement the negative feedback circuit, logic gates are incorporated at the beginning of each of the first and second sequences of internal stages. The logic gates have a first gate input coupled to the input node and a second gate input coupled in the negative feedback circuit to the final output node of the IC. The outputs of the respective logic gates are coupled to the respective first and second sequences and turn off the respective output pullup or pulldown transistor element after transmission of a data output signal.

The invention may be applied in more complex logic circuits for separate processing of split path monophase propagating logic signals. For example one of the first and second sequences of a logic circuit includes a different number of internal stages than the other sequence. The sequence with a lesser number of internal stages provides a relatively higher speed signal propagation path while the sequence with a greater number of internal stages provides a relatively slower speed signal propagation path. This aspect of the invention is applied to advantage for example in an 8 input NAND gate.

The example embodiments of the invention are described with particular reference to CMOS circuits with successive invertor stages of PMOS and NMOS transistor elements. In these examples, as summarized above, skewed ratios of current carrying capacity or conductance of the respective MOS transistor elements in the successive invertor stages are implemented by skewed ratios of the channel width of the respective MOS transistor elements. Typically the channel lengths are the same for MOS transistor elements fabricated according to a particular process so that conductance is varied by channel width. The invention may also be implemented in other semiconductor integrated circuit families including not only CMOS, but also all PMOS circuits, all NMOS circuits, BiCMOS, and bipolar circuits. In the case of bipolar transistor element circuits, skewed ratios of current carrying capacity or conductance in successive invertor stages are implemented as follows.

For example, in successive invertor stages of NPN transistor elements, the collector node of one NPN transistor element stage provides the output coupled to the base node of the next successive NP transistor element stage. The collector resistor for one stage also functions as the base resistor for the next stage. Within each stage, the collector resistor functions as the pullup element while the corresponding NPN transistor element functions as the pulldown element. For a bipolar implementation of the invention, a first sequence of bipolar invertor stages controls the output pullup transistor element at an output pullup driver node and a second sequence of bipolar invertor stages controls the output pulldown transistor element at an output pulldown driver node. The two split path sequences are coupled to a single input node.

Within each sequence of bipolar invertor internal stages skewed ratios of current carrying capacity or conductance between pullup and pulldown elements provide a monophase or single binary logic potential level signal propagating path. Because each stage consists of a resistor pullup element and for example an NPN transistor pulldown element it is the resistor conductance and transistor conductance that are skewed relative to each other. Thus, the current carrying capacities or conductances of the respective pullup collector resistor and corresponding pulldown bipolar transistor element are selected so that they are substantially unequal or skewed in favor of high speed propagation for example of the signal for turning on the respective final output pullup or pulldown transistor element.

In the output pullup control sequence of successive bipolar invertor internal stages, the signal for turning on the pullup transistor element is favored by a low resistance path characterized by high current carrying capacity and high conductance. On the other hand the signal path for turn off of the pullup transistor element becomes a vestigial high resistance path characterized by low current carrying capacity and low conductance. The second sequence of bipolar invertor internal stages for control of the pulldown transistor element is similarly skewed. While the first and second sequences are coupled to a single data input node, the split paths provide separate output driver nodes. An output pullup driver node drives the final output pullup transistor element (without a drive coupling to the final output pulldown transistor element). An output pulldown driver node for driving the final output pulldown transistor element (without a drive coupling to the pullup transistor element).

The principles of the present invention may therefore be implemented in any of the integrated circuit transistor families. Other objects, features and advantages of the invention are apparent in the following specification and accompanying drawings.

BRIEF DESCRIPTION OF THE DRAWINGS

FIG. 9 is a fragmentary schematic circuit diagram of an eight input NAND gate implemented in a single stage showing only one of the eight input paths. Extra input and output stages are also shown so that the circuit effectively functions as a NOR gate between the input $V_{in}$ and the output $V_{out}$.

FIG. 10 is a fragmentary schematic circuit diagram of an eight input NAND gate implemented in three stages and showing only one of the eight input paths. The extra input and output stages at either end also shown effectively convert the function of the circuit to a NOR gate.

DESCRIPTION OF PREFERRED EXAMPLE EMBODIMENTS AND BEST MODE OF THE INVENTION

Figure 1:
FIG. 1 is a schematic circuit diagram of a prior art CMOS 4 stage buffer amplifier circuit.
Figure 2:
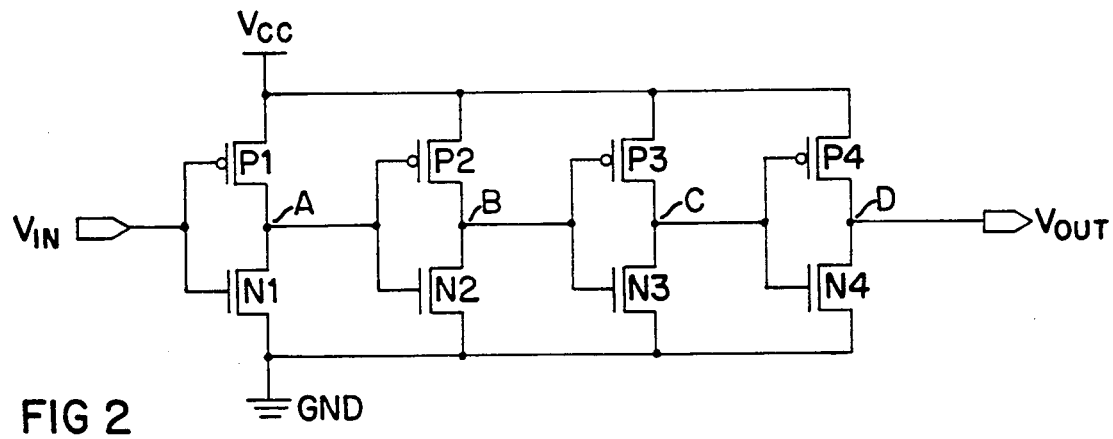
FIG. 2 is a detailed schematic circuit diagram of the 4 stage buffer amplifier circuit of FIG. 1.
Figure 3:
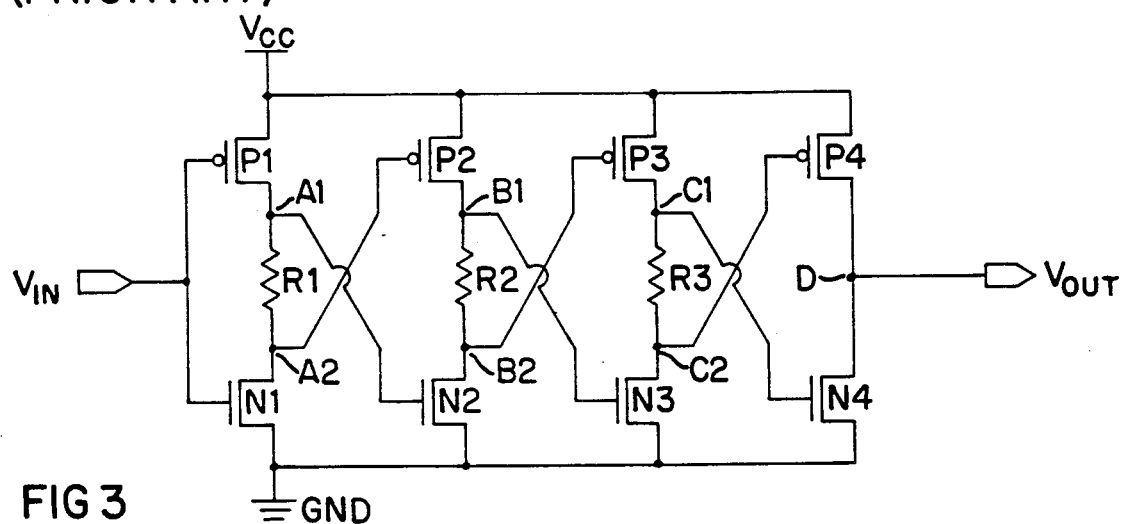
FIG. 3 is a schematic circuit diagram of a modification of the circuit of FIG. 2 providing a split path high speed substantially monophase on logic circuit according to the invention.

A modification of the multi-stage buffer amplifier circuit of FIGS. 1 & 2 according to the invention is illustrated in FIG. 3. Corresponding circuit elements are indicated by the same reference designations. As shown in FIG. 3, a split path resistor is coupled between the drain leads of the respective pullup and pulldown transistor elements of each stage. Thus, split path resistor R1 is coupled between the respective drain leads of transistor elements P1 and N1 of the first stage or input stage I1. Split path resistor R2 is coupled between the drain leads of respective transistors P2 and N2 of the second internal stage I2, etc.

Each internal stage therefore provides two split path output nodes on either side of the split path resistor. For example stage 1 provides split path output nodes A1 and A2 cross coupled respectively to the control gate nodes of transistors P2,N2 of the second stage. Split path output nodes B1,B2 of the second stage are cross coupled to the respective control gate nodes of transistor elements P3,N3 of the third stage etc. Thus, the drain node of the pullup transistor element of a previous stage is coupled to the control gate node of the pulldown transistor element of the next stage. The drain node of the pulldown transistor element of the previous stage is coupled to the control gate node of the pullup transistor element of the next stage. Finally in the output stage I4 the drain nodes of the pullup and pulldown transistor elements P4,N4 are coupled once again to a single biphase output node D which provides the buffer circuit output $V_{out}$.

The split path resistor elements R1,R2 and R3 effectively split the circuit into different signal propagation paths for controlling the output stage pullup and pulldown transistor elements P4,N4. For example a logic high potential level data input signal at the input node $V_{in}$ turns off the pullup transistor element P1 and turns on the pulldown transistor element N1. A relatively high speed logic low potential level monophase on logic signal appears at the first stage internal output node A2. A second relatively slow speed logic low signal appears at the first stage internal output node A1 after a delay introduced by split path resistor element R1. The relatively high speed inverted logic low signal at the internal output node A2 turns on the pullup transistor element P2 of the second stage and a relatively high speed logic high monophase on logic signal appears at the internal output node B1 of the second stage twice inverted from the input node $V_{in}$.

The relatively high speed signal propagation path is completed by turning on pulldown transistor element N3 of the third stage and providing a relatively high speed logic low monophase on logic signal at the internal output node C2 of the third stage. The relatively high speed logic low signal at internal output node C2 delivers most of the input data signal energy for turning on the output stage pullup transistor element P4 at relatively high speed. Thus, the signal path defined by circuit elements N1,A2,P2,B1,N3,C2,P4,D provides a relatively high speed low resistance monostate on logic signal propagation path which applies most of the signal energy for relatively high speed turn on of the output pullup transistor element P4 for delivering a logic high data output signal to the final output node $V_{out}$. In this relatively high speed signal propagation path the primary signal energy is allocated for turning on the sequence of transistor elements N1,P2,N3,P4 and is therefore referred to as the "on logic" circuit or on logic circuit path.

At the same time a minor portion of the input data signal propagates through a separate relatively slower speed higher resistance signal propagation path for turning off the output pulldown transistor element N4. At each stage, the on transistor of one stage turns off a complementary resistor of the next stage only through the split path resistor element and relatively slow speed internal output node. Thus, for a high logic level input data signal at input node $V_{in}$ transistor N1 of the first stage is able to turn off the pulldown transistor element N2 of the next stage only through the split path resistor element R1 and the relatively slow speed low logic level signal at the internal output node A1. The on transistor element P2 of the second stage turns off pullup transistor element P3 of the third stage through the relatively slow signal propagation path R2,B2. Finally the on transistor element N3 of the third stage turns off the output pullup transistor element N4 through the relatively slow speed signal propagation path R3,C1. The succession of signal propagation paths turning off successive transistor elements of the sequence of internal stages may be viewed as a relatively slow speed "off logic" circuit or off logic signal propagation path.

A counterintuitive result of introducing resistors R1,R2 and R3 into the multi-stage buffer amplifier is that signal propagation speed is actually increased between the input node $V_{in}$ and the final output node $V_{out}$. This result is achieved because the split path resistors are arranged to define a relatively high speed and relatively low resistance on logic circuit path which allocates most of the signal energy to the task of turning on successive transistor elements in the sequence of internal stages for relatively high speed turn on of the final output pullup or pulldown transistor element. On the other hand signal propagation energy or current drive for turning off the complementary transistor element of successive stages is constrained by a relatively slower speed higher resistance signal propagation path so that only a minor portion of the input data signal energy is allocated to the task of turning off successive transistor elements in the sequence of internal stages. The net result is higher speed signal propagation to the output.

A similar result is achieved for a logic low potential level data signal at the input node $V_{in}$. The logic low signal turns on the pullup transistor element P1 and turns off the pulldown transistor element N1 of the first stage I1. A relatively high speed and inverted logic high level monophase on logic signal appears at the internal output node A1 while a relatively slower speed logic high potential signal appears at the internal output node A2 as a result of the delay interposed by split path resistor element R1. The relatively high speed monostate on logic signal propagation path therefore follows the circuit path P1,A1,N2,B2,P3,C1, N4,D for relatively high speed turn on of the output pulldown transistor element N4 for delivering a logic low data output signal to the final output node $V_{out}$. The logic low input data signal therefore propagates at relatively high speed to provide a logic low output data signal at relatively high speed at the final output node $V_{out}$.

On the other hand the on transistor element P1 is able to turn off the pullup transistor element P2 of the next stage only by way of the relatively slow speed signal propagation path R1,A2 etc. Finally the on transistor element P3 of the third stage is constrained to turn off the output pullup transistor element P4 through the relatively slow speed signal propagation path R3,C2. As a result most of the input data signal energy is applied through the relatively high speed monostate on logic signal propagation path for turning on the pulldown transistor element N4. Only a minor portion of the input data signal energy through the relatively slow speed and relatively higher resistance signal propagation path is utilized for turning off the output pullup transistor element P4.

Figure 4:
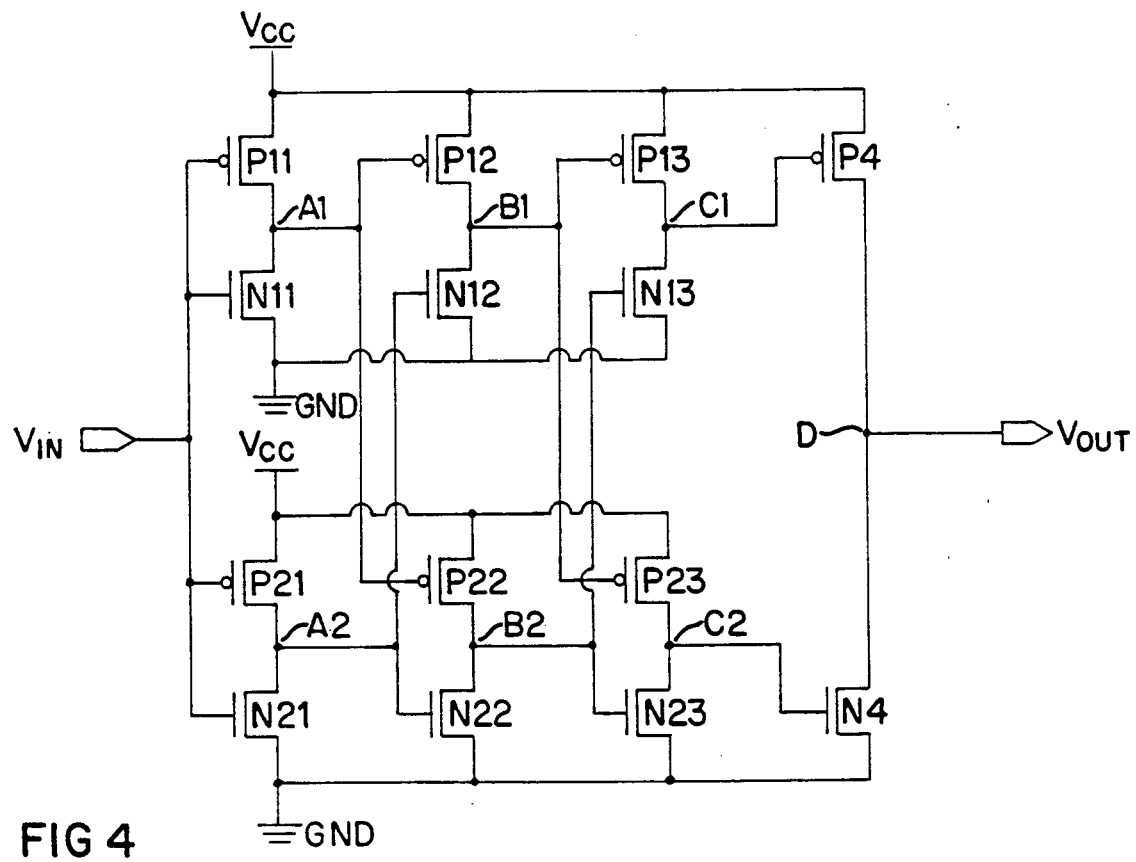
FIG. 4 is a schematic circuit diagram of a split path monophase on logic buffer amplifier circuit according to the invention in which the path splitting intermediate circuit is implemented by mixed internal stages of active transistor elements without resistors.

The intermediate circuit elements for defining split path on logic signal propagation paths can be implemented without resistors using active transistor elements as illustrated in FIG. 4. According to this embodiment of the invention separate on logic signal propagation paths for separate control of turn on the respective output pullup and pulldown transistor elements P4,N4 is implemented by mixed sequences of internal stages. As shown in FIG. 4 the input data signal at input node $V_{in}$ is applied to the first stage pullup and pulldown transistor elements P11, N11 of a first sequence of mixed internal stages providing an output pullup control sequence to initiate separate control of the turn on and turn off of output pullup transistor element P4. The input data signal is also applied to the first stage pullup and pulldown transistor elements P21, N21 of a second sequence of mixed internal stages providing an output pulldown control sequence to initiate separate control of turn on and turn off of the output pulldown transistor element N4.

As illustrated in FIG. 4, the internal second and third stages of the respective first and second sequences are coupled with respective pullup transistor elements in pairs and respective pulldown transistor elements in pairs providing mixed internal stages. For example in the second stage of the output pullup control sequence and the output pulldown control sequence, the control gate leads of the pullup transistor elements P12 and P22 are coupled in a pair to the internal output node of the input stage P11,N11 of the first sequence. The control gate leads of the respective pulldown transistor elements N12 and N22 are coupled in a pair to the internal output node from the first stage P21,N21 of the output pulldown control sequence.

As hereafter more fully described with reference to FIG. 6, the channel widths of the respective PMOS and NMOS transistor elements of the first and second sequences are selected to provide a separate relatively high speed and high current drive on logic control path for each of the output pullup and pulldown transistor elements P4,N4. For example, as illustrated in FIG. 4 the relatively high signal propagation on logic path for a logic high level signal at the input node $V_{in}$ is provided by transistor elements N11,P22,N13,P4. This signal path is described as a monostate or monophase on logic signal propagation path because each transistor element turns on the next transistor element in the sequence. In particular the sequence turns on the output pullup transistor element P4.

The transistors of the first on logic path N11,P22,N13,P4 are selected to have relatively large channel width for applying most of the input data signal energy for turning on the output pullup transistor element P4. At the same time the output pulldown transistor element N4 is turned off by a relatively small channel width NMOS transistor element N23 which is also actuated by the high level logic signal at the input node $V_{in}$. Other complementary off transistor elements of the sequence, N22 and P11, are also selected to have relatively small current drive capacity. As a result most of the propagating signal energy therefore is expended turning on the pullup transistor element P4 for transmitting a high logic level data output signal to the final output node $V_{out}$ at relatively high speed.

Similarly, a low logic level input data signal at the input node $V_{in}$ propagates through a relatively high speed on logic output pulldown control path defined by active transistor elements P21,N12,P23 and N4. The transistor elements of this on logic sequence are also selected to have relatively large current carrying capacity and large channel width for high speed propagation and transmission of a logic low level output data signal to the final output node $V_{out}$. At the same time the output pullup transistor element P4 is turned off by a relatively small channel width and relatively small current drive PMOS transistor element P13. The remaining complementary off transistor elements P12 and N21 of the pertinent sequence are also selected to have relatively small channel width so that the major portion of input data signal energy is utilized for turning on the output pulldown transistor element N4.

Figure 5:
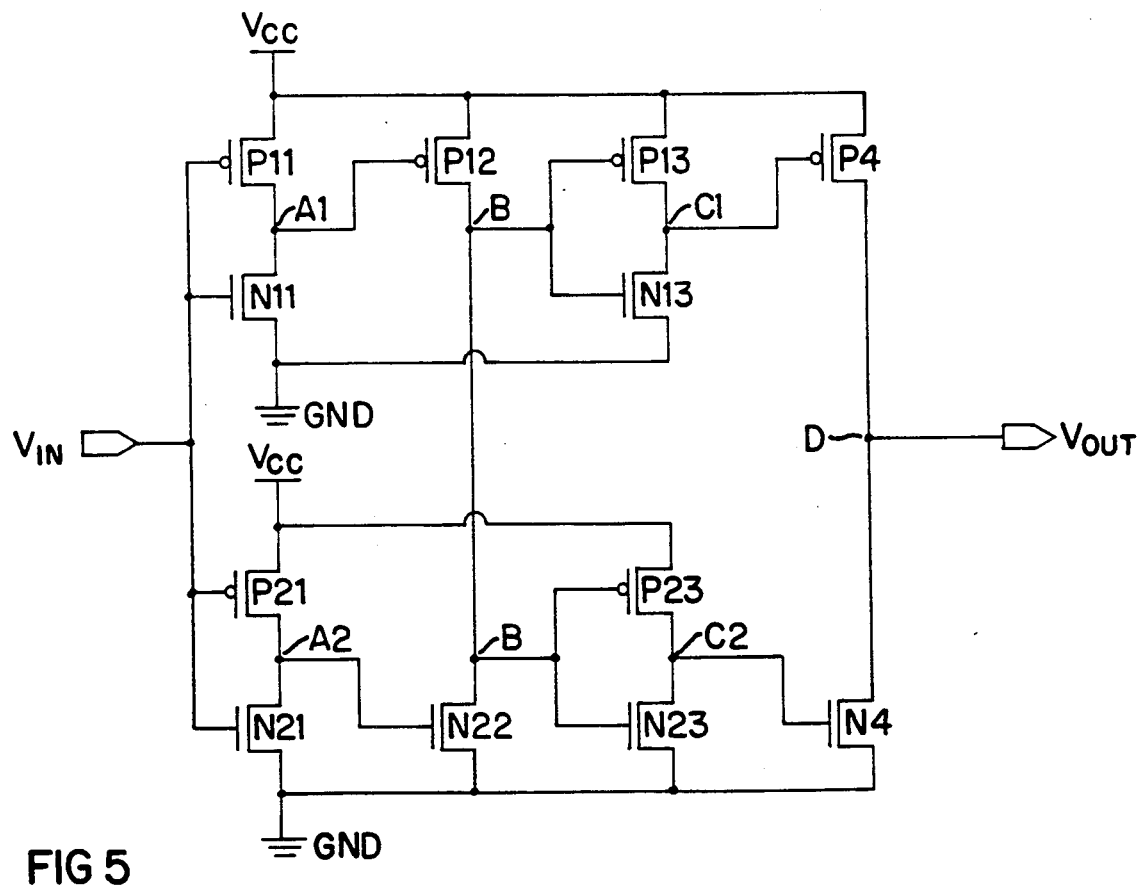
FIG. 5 is a schematic circuit diagram of an alternative configuration of the circuit of FIG. 4 using mixed internal stages.

FIG. 5 illustrates a modification of the split path multi-stage buffer amplifier circuit of FIG. 4. In the example of FIG. 5 the split path monophase on logic circuit paths from the first and third stages are alternately returned to a single bistate or biphase signal path at the second and fourth stages. More specifically, the split path internal output nodes A1 and A2 are derived from the respective input stages P11,N11 and P21,N21 of the first and second sequences. The second stage consists of a single internal stage P12,N22 for both sequences with the internal output node A1 driving the pullup transistor element P12 and the internal output node A2 driving the pulldown transistor element N22. Each of the internal output nodes A1 and A2 is a single phase or monophase signal node because it controls only one transistor element. The single output node B from the second stage however returns to a biphase or bistate signal propagation path because the internal node B controls at the same time both the turn on and turn off of pullup and pulldown transistor elements of the third stage. At the third stage, signal propagation is again divided between two separate monostate or monophase signal propagation paths for separate on logic control of the respective final output pullup and pulldown transistor elements P4,N4. Pullup driver node C1 controls the final output pullup transistor element P4 alone. Pulldown driver node C2 controls the final output pulldown transistor element N4 alone. The biphase or bistate signal propagation path is restored at the final output node D. The channel widths of the respective PMOS and NMOS transistor elements are again selected to provide relatively large current drive transistor elements for the respective on logic signal propagation paths for allocating most of the input data signal energy for turning on either the output pullup or pulldown transistor element.

Figure 6:
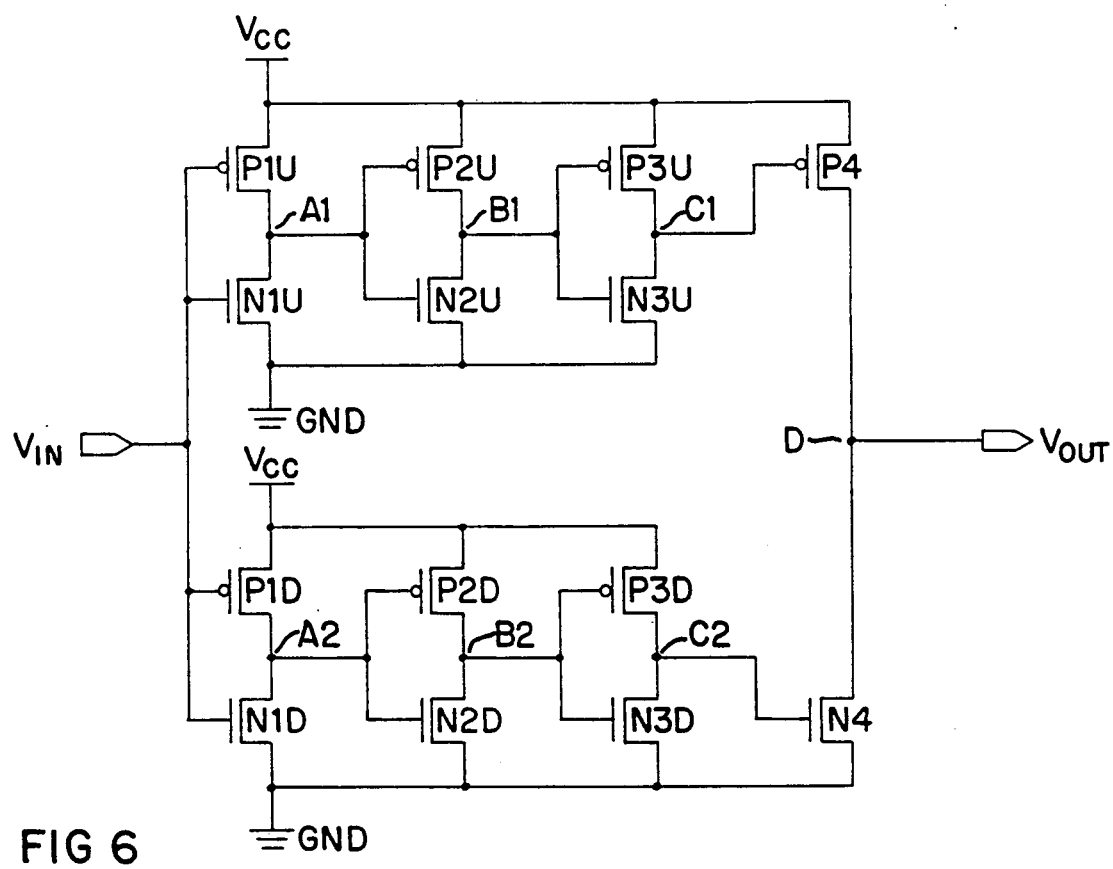
FIG. 6 is a schematic circuit diagram of a split path monophase on logic buffer amplifier circuit according to the invention in which the path splitting intermediate circuit is implemented by separate first and second sequences of separate internal stages.

A more complete analysis of the selection of respective channel widths and current drive capacities for respective pullup and pulldown transistor elements is provided by the circuit embodiment of FIG. 6 and corresponding Table II. The intermediate circuit elements for providing split path on logic circuit signal propagation paths are arranged for clear delineation of first and second (upper and lower) sequences of internal stages. An input data signal at the input node $V_{in}$ is applied at the same time to the first stage or input stage of the respective first and second sequences.

For a logic high level signal at the input node $V_{in}$, the relatively high speed monophase or monostate on logic path is defined through the first sequence of internal stages beginning with input stage P1U, N1U. The sequence of on transistors N1U, P2U, N3U and P4 defines the monophase on logic signal propagation path for turning on the output pullup transistor element P4. Internal node or driver node C1 of the third stage drives only the pullup transistor element P4 without having to drive at the same time the pulldown transistor element N4. As shown in TABLE II the on transistor elements N1U, P2U and N3U are selected to have relatively large channel width and current carrying capacity so that most of the input data signal energy is allocated for turning on the output pullup transistor element P4. At the same time a relatively small transistor element N3D in the monophase off logic signal propagation path turns off the pulldown transistor element N4 in response to a high logic level signal at the input node $V_{in}$. The monophase off logic signal propagation path in response to a high logic level signal at the input node $V_{in}$ includes transistor elements N1D, P2D, N3D, and N4. As shown in Table II these transistor elements all represent relatively small channel width and small current drive transistor elements.

For a logic low level input data signal, the relatively high speed monophase on logic circuit path is defined by transistor elements P1D, N2D, P3D, and N4. As set forth in Table II this sequence of transistor elements is provided by relatively large channel width and current drive transistor elements for allocation of most of the input data signal energy for turn on of the pulldown transistor element N4. A logic low level input data signal is therefore transmitted to the final output node D or $V_{out}$ at relatively high speed. At the same time the output pullup transistor element P4 is turned off by a relatively small channel width transistor element P3U. The monophase off logic signal propagation path for a logic low level input data signal includes relatively small channel width transistor elements P1U, N2U and P3U. By reason of the split control paths the internal output node or driver node C2 from the third stage turns on the pulldown transistor element N4 without at the same time having to turn off the pullup transistor element P4.

TABLE II

| PMOS & NMOS CHANNEL WIDTHS ($\mu$) (FIG 6) | |
|---|---|
| Transistor element | Channel Width ($\mu$) |
| P1U | 2 |
| N1U | 15 |
| P2U | 100 |
| N2U | 10 |
| P3U | 50 |
| N3U | 160 |
| P4 | 1600 |
| P1D | 17 |
| N1D | 1 |
| P2D | 12 |
| N2D | 20 |
| P3D | 200 |
| N3D | 10 |
| N4 | 640 |

It is apparent that the ratios of PMOS and NMOS channel width values for the pullup and pulldown transistor elements of respective internal stages are substantially skewed from the ratio of values which produce substantially equal current carrying capacity and current drive. As set forth in Table II, the ratio of values for at least the second and third stages approaching the output pullup and pulldown transistor elements is at least 3 times and typically in the range of 3 to 15 times the ratio of values for equal current drive. Preferably the skew of ratios is in the order of approximately 5 times the ratio for substantially equal current drive. By the alternate skewing of the ratio in successive stages of a sequence in favor of the on logic transistors for turn on of the respective output pullup or pulldown transistor element, most of the signal propagation energy and current drive are expended for turn on of the respective output pullup or pulldown transistor element. The relatively small channel width off logic path becomes a relatively vestigial signal propagation path which turns off the complementary output pullup or pulldown transistor element at relatively slower speed. It is the combination of splitting of the signal propagation control sequences and alternately skewing the values of the respective transistor elements in each stage of the sequences that achieves the high speed circuit structures of the invention.

Figure 7:
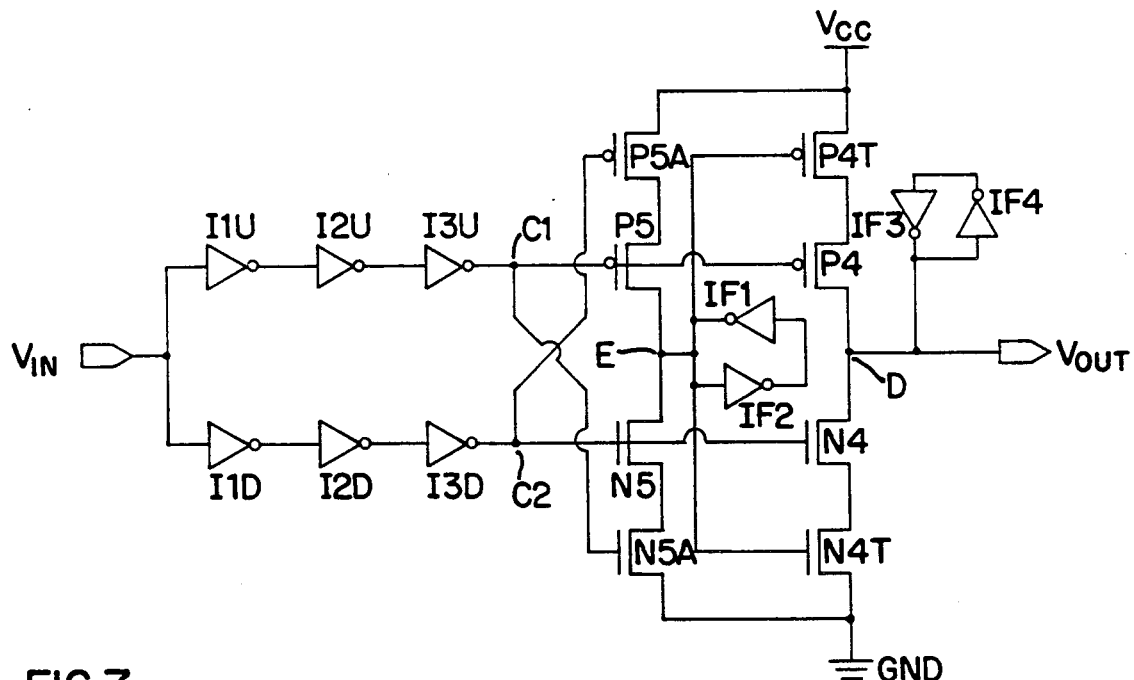
FIG. 7 is a schematic circuit diagram of the circuit of FIG. 6 with the addition of a cutoff circuit for cutting off the output pullup and pulldown transistor elements from the respective high and low potential power rails a time delay after transmission of an output data signal, and with a data saver circuit for saving the data signal at the final out node during cutoff.

An improvement of the multi stage buffer amplifier circuit of FIG. 6 for reducing crowbar current or contention current caused by simultaneous conduction of the output pullup and pulldown transistor elements P4,N4 is illustrated in the schematic circuit diagram of FIG. 7. In the circuit of FIG. 7 the first three stages of the pullup control sequence or first control sequence for separately controlling the pullup transistor element P4 are represented in FIG. 7 by invertor stages I1U, I2U, and I3U. The first three stages of the pulldown control sequence or second control sequence for controlling the conducting state of the pulldown transistor element N4 are represented in the circuit of FIG. 7 by invertor stages I1D, I2D, and I3D. The channel widths of transistor elements of these respective stages are, for example, the same as that for the first three stages of FIG. 6, TABLE II. As shown in FIG. 7 an output cutoff circuit is coupled to the internal output nodes C1 and C2 in parallel with the output pullup and pulldown transistor elements P4, N4. The output cutoff circuit performs the function of cutting off the output pullup and pulldown transistor elements P4, N4 from the respective high and low potential power rails $V_{cc}$, GND, a prescribed time delay after transmission of an output data signal at the final output node $V_{out}$.

Internal output node C1 following the third stage of the pullup control sequence provides a driver node for the output pullup transistor element P4 and at the same time for the cutoff circuit delay stage P5, N5A. The internal output node C2 following the third stage of the pulldown control sequence provides a driver node for the output pulldown transistor element N4 and at the same time for the cutoff delay stage P5A, N5. The output cutoff delay stages P5, N5A and P5A, N5 have respective pullup and pulldown transistor elements coupled in series to control a single cutoff output node E which drives the cutoff transistor elements P4T, N4T.

The pullup cutoff transistor element P4T is coupled in series with the output pullup transistor element P4 to the high potential power rail $V_{cc}$. When pullup cutoff transistor element P4T is turned off, it cuts off the output pullup transistor element P4 from the high potential power rail $V_{cc}$. The pulldown cutoff transistor element N4T is coupled in series with pulldown transistor element N4 to the low potential power rail GND. Pulldown cutoff transistor element N4T when it is turned off cuts off the pulldown transistor element N4 from the ground potential power rail. According to the circuit configuration of FIG. 7, one stage delay after transmission of an output data signal to the final output node D or $V_{out}$, the final output node D and output pullup and pulldown transistor elements P4, N4 are cutoff from the high and low potential power rails by the cutoff transistor elements P4T and N4T. The cutoff signal is latched or saved at the output cutoff node E by back to back cross coupled feedback invertor stages IF1, IF2. The output data signal is maintained by cross coupled feedback invertor stages IF3, IF4 coupled to the final output node. By this arrangement power dissipation from simultaneous conduction of pullup and pulldown transistor elements P4, N4 is minimized while saving the output data signal at the final output node.

Figure 8:
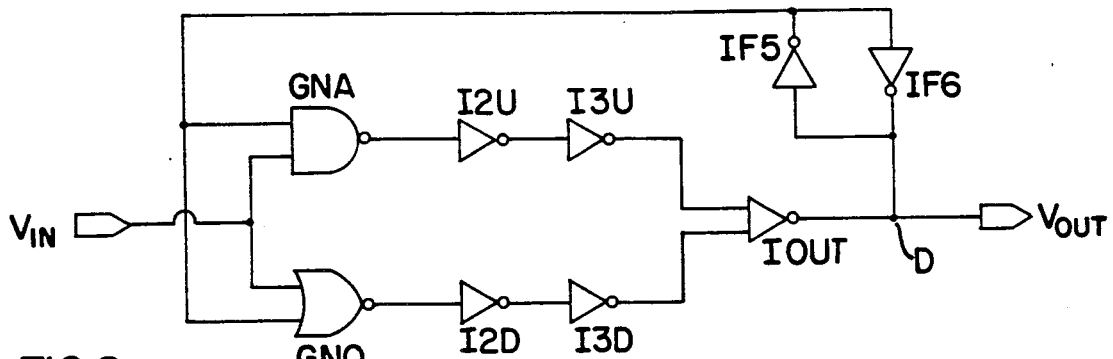
FIG. 8 is a schematic circuit diagram illustrating the preferred embodiment of a split path four stage buffer amplifier circuit with addition of a negative feedback circuit between the final output node and the respective first and second sequences for turning off the output pullup and pulldown transistor elements after feedback delay following transmission of an output data signal. A data saver circuit is coupled to the final output node for saving the output data signal during turn off.

A preferred circuit embodiment for split and skewed signal propagation paths for separate control of the output pullup and pulldown transistor elements while reducing simultaneous conduction and power dissipation is illustrated in FIG. 8. In the schematic circuit diagram of FIG. 8, the second and third internal stages of the output pullup control sequence are represented by invertor stages I2U and I3U similar to the second and third internal stages of FIG. 6. The second and third internal stages of the output pulldown control sequence are represented by invertor stages I2D, I3D also similar to the second and third internal stages of FIG. 6. The output stage of FIG. 8 is represented by invertor stage IOUT similar to P4,N4 of FIG. 6.

The first stage or input stage of the output pullup control sequence is replaced by a logic gate, NAND gate GNA. The first stage or input stage of the output pulldown control sequence is replaced by the logic gate, NOR gate GNO. A first gate input from each of the logic gates GNA, GNO is coupled to the input node $V_{in}$. A second gate input from each of the logic gates GNA, GNO is coupled through an output feedback circuit provided by feedback invertor stage IF5 to the final output node $V_{out}$. Following transmission of an output data signal to the final output node D or $V_{out}$, a negative feedback signal through feedback invertor stage IF5 and through logic gates GNA, GNO turns off the output pullup and pulldown transistor elements P4, N4 of output stage IOUT. As a result, power dissipation caused by simultaneous conduction is minimized while the output data signal is saved at the final output node by cross coupled feedback invertor stages IF5, IF6.

As indicated by the generalized logic diagram of FIG. 8, the preferred circuit embodiment of FIG. 8 can be implemented in any IC logic circuit family, for example CMOS, PMOS, NMOS, BiCMOS and bipolar.

The difference in function and operation between the circuits of FIG. 7 & 8 is as follows. The circuit of FIG. 7 provides a cutoff of the output pullup and pulldown transistor elements a prescribed time period, namely one invertor stage delay after transmission of an output data signal to the final output $V_{out}$. Because the delay is preprogrammed, the components may have to be adjusted for different load applications to assure that transmission of the data output signal to the final output node is complete before the output pullup and pulldown transistor elements are cutoff. On the other hand, in the circuit of FIG. 8, the cutoff delay before turn off of the output pullup and pulldown transistor elements is automatically self adjusting according to the load at the final output node. Thus, feedback of the negative feedback signal through feedback invertor stage IF5 for turn off of the output pullup and pulldown transistor elements does not take place until transmission of the output data signal to the final output node D is complete.

Figure 11:
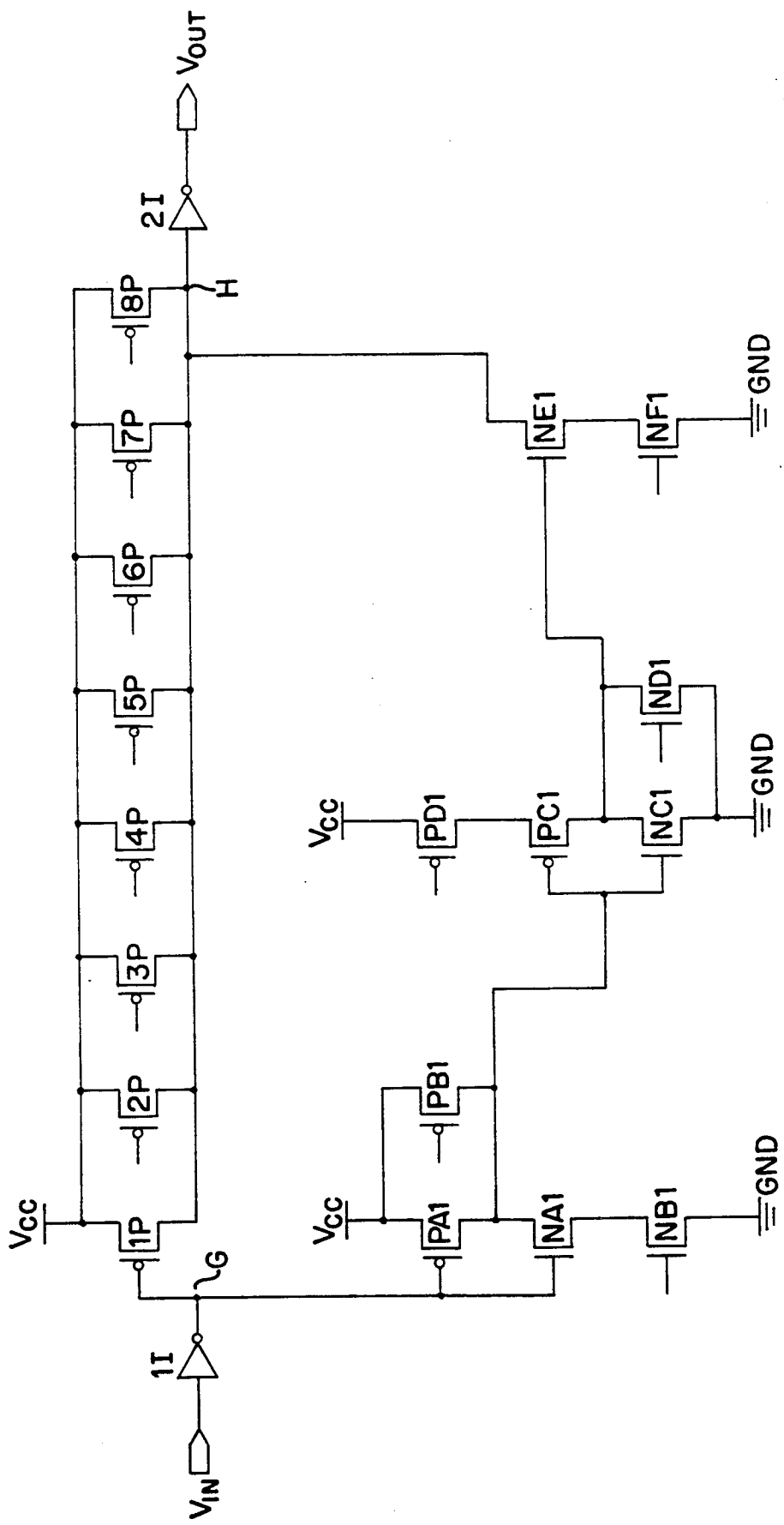
FIG. 11 is a fragmentary schematic circuit diagram of a split path monophase 8 input NAND gate according to the invention implemented with a single stage in one path and three stages in the other path and showing only one of the 8 input split path combinations. The extra input and output buffers are also shown which convert the NAND gate to a NOR gate.

Another application of the invention is illustrated with reference to FIGS. 9–11 showing two alternative prior art 8-input NAND gates in the circuits of FIGS. 9 & 10 and a further embodiment of the invention in the circuit of FIG. 11. In the circuit of FIG. 9 the 8-input NAND gate is implemented in a single stage. The 8-input NAND gate 1P–8P, 1N–8N is coupled between input and output invertor stages 1I, 2I effectively providing an overall NOR gate. Only one of the 8-input paths of the gate is shown in full in order to save space and the remaining open inputs are completed in the same manner as the first input.

A disadvantage of the prior art single stage 8-input logic gate of FIG. 9 is that the 8 NMOS input transistors are coupled in series causing a very slow signal propagation time between the input node $V_{in}$ and the output node $V_{out}$. In addition to the inherent slowness of the series coupling, the series NMOS resistors also increase the parasitic capacitance of the circuit.

To increase the speed of operation, the 8 input NAND gate is implemented in three stages in the prior art circuit of FIG. 10. Only one of the 8 input paths is shown completed in the three stages to save space. The first stage actually consists of four "2-input" NAND gates, showing one of the "2-input" NAND gates, PA,-NA,PB,NB. The second stage actually consists of two "2-input" NAND gates showing one of the "2-input" NAND gates PC,NC,PD,ND. The third stage consists of one final "2-input" NAND gate PE,NE,PF,NF. It is noted that the 8-input NAND gate is again coupled between input and output invertor stages 1I and 2I forming an overall NOR gate. A faster circuit is provided by reducing the number of NMOS transistor elements coupled in series according to the prior art circuit of FIG. 10.

The present invention provides an improved 8-input NAND gate logic circuit by combining portions of the circuits of FIGS. 9 & 10 a split path monophase on logic circuit as illustrated in FIG. 11. In the hybrid circuit of FIG. 11, the bistate or biphase signal propagation path from the input node $V_{in}$ is split at node G. The upper split path is a single stage feed forward signal propagation pullup control path for separately controlling the pullup transistor elements 1P–8P for the 8 inputs. The lower split path is a three stage signal propagation pulldown control path for separately controlling the pulldown transistor elements and the final NMOS transistor elements NE1,NF1 of the third stage "2 input" NAND gate. The split path monophase signal propagation paths are recombined at node H to provide a biphase or bistate signal propagation path at the final output node $V_{out}$. It is noted once again that the 8-input NAND gate is coupled between input and output buffer stages 1I and 2I. Furthermore only one of the 8-input paths is completed and illustrated in FIG. 11.

The split path configuration according to the invention shown in the circuit of FIG. 11 permits introduction of a different number of stages in the respective pullup control path and pulldown control path. In the example of FIG. 11 the upper path processes the 8 monophase pullup transistor element signals in a single stage with a single stage delay. The lower path processes the 8 monophase pulldown signals through three stages with a three stage delay. Thus, the split paths are used for the purpose of inserting additional stages in one of the paths to reduce the number of NMOS transistor elements coupled in series.

Another purpose for the split path circuit configuration of the invention may be to introduce high speed tristate enable and disable circuits as shown for example in FIGS. 7 and 13 of applicant's co-pending U.S. patent application Ser. No. 508,283, filed Apr. 9, 1990 for TTL TO CMOS TRANSLATING CIRCUITS WITHOUT STATIC CURRENT.

While the invention has been described with reference to particular MOS example embodiments it is intended to cover all modifications and equivalents, including implementation in other integrated circuit families, within the scope of the following claims.

I claim:

1. An integrated circuit (IC) having an input node for receiving input data signals of high and low potential, an output stage coupled between high and low potential power rails, said output stage having an output pullup transistor element coupled to the high potential power rail and an output pulldown transistor element coupled to the low potential power rail, and a final output node coupled between the output pullup and pulldown transistor elements for transmitting output data signals of high and low potential, comprising:

intermediate path splitting circuit means coupled between the input node and output stage defining a plurality of different signal propagation paths including:

a relatively higher speed output pullup turn on signal propagation path coupled between the input node and the output pullup transistor element for turning on the output pullup transistor element at relatively higher speed in response to a first input data signal at the input node;

a relatively slower speed output pulldown turn off signal propagation path coupled between the input node and output pulldown transistor element for turning off the output pulldown transistor element at a relatively slower speed in response to said first input data signal;

a relatively higher speed output pulldown turn on signal propagation path coupled between the input signal propagation path and output pulldown transistor element for turning on the output pulldown transistor element at relatively higher speed in response to a second input data signal at the input node;

and a relatively slower speed output pullup turn off signal propagation path coupled between the input node and output pullup transistor element for turning off the output pullup transistor element at relatively slower speed in response to said second data input signal;

thereby providing relatively higher speed and slower speed signal propagation paths for control of turn on and turn off of the respective output pullup and pulldown transistor elements.

2. The IC of claim 1 wherein the intermediate path splitting circuit means comprises a plurality of sequential internal stages, said internal stages having a pullup transistor element coupled to the high potential power rail, a pulldown transistor element coupled to the low potential power rail, a split path resistor coupled between the pullup and pulldown transistor elements, and internal split path output nodes on either side of said split path resistor, said internal split path output nodes being cross coupled respectively to pulldown and pullup transistor elements of a next internal stage, thereby providing said relatively higher speed and slower speed signal propagation paths.

3. The IC of claim 2 wherein the pullup and pulldown transistor elements are characterized as having a sourcing or sinking current pat between source and drain nodes and a third control gate node for controlling the conducting state of the sourcing or sinking current path, and wherein the split path output node adjacent to the pullup transistor element of one internal stage is coupled to the control gate node of the pulldown transistor element of a next internal stage and wherein the split path output node adjacent to the pulldown transistor element of said one internal stage is coupled to the control gate node of the pullup transistor element of said next internal stage.

4. The IC of claim 1 wherein the intermediate path splitting circuit comprises:

a first sequence of output pullup control internal stages each having pullup and pulldown elements and an internal output node between the pullup and pulldown elements, said output pullup control internal stages including an output pullup driver stage having a driver output node coupled to drive the output pullup transistor element and not the output pulldown transistor element;

said sequence of output pullup control internal stages defining the relatively higher speed output pullup turn on signal propagation path and the relatively slower speed output pullup turn off signal propagation path;

a second sequence of output pulldown control internal stages each having pullup and pulldown elements and an internal output node between the pullup and pulldown elements, said output pulldown control internal stages including a pulldown driver stage having a driver output node coupled to drive the output pulldown transistor element and not the output pullup transistor element;

said sequence of output pulldown control internal stages defining the relatively higher speed output pulldown turn on signal propagation path and the relatively slower speed output pulldown turn off signal propagation path;

said respective sequences being coupled to the input node for providing said relatively higher speed and relatively slower speed signal propagation paths for control of turn on and turn off of the respective output pullup and pulldown transistor elements.

5. The IC of claim 4 wherein the first and second sequences comprise internal stages with respective pullup and pulldown elements characterized as having a sourcing or sinking current path in a channel between source and drain nodes and a third control gate node for controlling the conducting state of the respective sourcing or sinking current path, said internal stages having pullup and pulldown elements with respective conductances in skewed ratios selected to provide substantially greater current drive in sourcing and sinking current paths for turning on one of the respective output pullup or pulldown transistor element and for providing substantially less current drive in sourcing and sinking current paths for turning off the other of the respective output pullup or pulldown transistor element.

6. The IC of claim 5 wherein the skewed ratio of conductances of the respective pullup and pulldown elements of at least one internal stage of said first and second sequences is at least approximately 3 times the ratio that provides substantially equal current drive through the sourcing and sinking current paths of the respective pullup and pulldown elements.

7. The IC of claim 6 wherein said skewed ratio of conductances is approximately 5 times the ratio that produces substantially equal current drive or greater.

8. The IC of claim 4 further comprising:
negative feedback circuit means coupled between the final output node and the respective first and second sequences, for turning off the respective output pullup and pulldown transistor elements after a feedback coupling circuit means time delay following propagation of a data input signal to the final output node, said negative feedback circuit incorporating a data saver circuit means coupled to the final output node for saving the output data signal after turn off of the output pullup and pulldown transistor elements by the negative feedback coupling circuit means.

9. The IC of claim 4 wherein each of the first and second sequences further comprises:
logic gate means having a first gate input coupled to the input node and a second gate input coupled in a feedback coupling circuit to the final output node of the IC, said logic gate means having an output coupled to the respective sequence of internal stages, said feedback coupling circuit including an invertor stage for negative feedback of a data output signal at the final output node of the IC, said logic gate means turning off the respective output pullup or pulldown transistor element after a feedback coupling circuit time delay following propagation of a data input signal to the final output node, said first and second sequences thereby holding off the output pullup and pulldown transistor elements after transmission of a data output signal.

10. The IC of claim 9 wherein the feedback coupling circuit comprises a data saver circuit means coupled to the final output node for saving the output data signal after turn off of the output pullup or pulldown transistor elements by the feedback coupling circuit and logic gate means.

11. The IC of claim 10 wherein the invertor stage and data saver circuit means of the feedback coupling circuit are provided by a pair of back to back cross coupled feedback invertor stages.

12. The IC of claim 4 further comprising:
cutoff circuit means for cutting off the output pullup and pulldown transistor elements from the respective high and low potential power rails a time delay after transmission of an output data signal at the final output node.

13. The IC of claim 4 wherein the first and second sequences each comprise a cutoff delay stage means coupled in parallel with the respective output pullup or pulldown transistor element to the respective driver output node;
wherein the IC further comprises an output pullup cutoff transistor element coupled in series with the output pullup transistor element, and an output pulldown cutoff transistor element coupled in series with the output pulldown transistor element;
said first sequence cutoff delay stage means being coupled to the respective output pullup cutoff transistor element for cutting off the respective output pullup transistor element a predetermined delay period after propagation of a data input signal to the final output stage and said second sequence cutoff delay stage means being coupled to the respective output pulldown cutoff transistor element for cutting off the respective output pulldown transistor element a predetermined delay period after propagation of a data signal to the final output stage.

14. The IC of claim 13 comprising a first data saver circuit coupled to the final output node for saving an output data signal during cutoff of the output pullup and pulldown transistor elements.

15. The IC of claim 14 wherein said cutoff delay stage means comprise a cutoff output node coupled to the respective output pullup and pulldown cutoff transistor elements and a second data saver circuit coupled to the cutoff output node for holding a cutoff signal at the respective cutoff transistor elements.

16. The IC of claim 4 wherein one of said first and second sequences comprises a different number of internal stages than the other sequence thereby providing a relatively higher speed signal propagation path through the sequence with the lesser number of internal stages and a relatively slower speed signal propagation path through the sequence with a greater number of internal stages.

17. The IC of claim 16 wherein the first and second sequences are arranged to provide a logic gate.

18. An integrated circuit having an input node for receiving input data signals of high and low potential, an output stage coupled between high and low potential power rails, said output stage having an output pullup transistor element coupled to the high potential power rail, an output pulldown transistor element coupled to the low potential power rail, and a final output node between the output pullup and pulldown transistor elements for transmitting output data signals of high and low potential, comprising:
intermediate path splitting circuit means coupled between the input node and the output stage comprising a plurality of internal stages each having a pullup transistor element, pulldown transistor element and an internal output node, said pullup and pulldown transistor elements having a sourcing or sinking current path in a channel between source and drain nodes, and a third control gate node for controlling the conducting state of the channel, said internal stages comprising:
a first sequence of output pullup control internal stages coupled at one end to the input node and including an output pullup driver stage having a driver output node coupled to the control gate node of the output pullup transistor element and not the output pulldown transistor element;
and a second sequence of output pulldown control internal stages coupled at one end to the input node and including an output pulldown driver stage having a driver output node coupled to the control gate node of the output pulldown transistor element and not the output pullup transistor element;
said first and second sequences comprising internal stages with respective pullup and pulldown transistor elements having conductances in skewed ratios selected to provide substantially greater current drive through sourcing and sinking current paths for turning on the respective output pullup or pulldown transistor element and substantially less current drive through sourcing and sinking current paths for turning off the respective output pullup or pulldown transistor element.

19. The IC of claim 18 wherein said first and second sequences of internal stages define:
  a relatively higher speed first signal propagation path from the input node to the output pullup transistor element providing a monophase on logic control path for turning on the output pullup transistor element at a relatively higher speed in response to a first data input signal;
  a relatively slower speed second signal propagation path from the data input node to the output pulldown transistor element providing a monophase off logic control path for turning off the output pulldown transistor element at a relatively slower speed in response to said first data input signal;
  a relatively higher speed third signal propagation path from the data input node to the output pulldown transistor element providing a monophase on logic control path for turning on the output pulldown transistor element at a relatively higher speed in response to a second data input signal;
  and a relatively slower speed fourth signal propagation path from the data input node to the output pullup transistor element providing a monophase off logic control path for turning off the output pullup transistor element at a relatively slower speed in response to said second data input signal.

20. The IC of claim 18 wherein the skewed ratio of conductances of the respective pullup and pulldown transistor elements of at least one internal stage of each of said first and second sequences is at least approximately 3 times the ratio that produces substantially equal current drive through the sourcing and sinking current paths of the respective pullup and pulldown transistor elements.

21. The IC of claim 20 wherein said skewed ratio of channel widths is approximately 5 times the ratio that produces substantially equal current drive.

22. The IC of claim 18 further comprising:
  negative feedback circuit means coupled between the final output node and the respective first and second sequences, for turning off the respective output pullup and pulldown transistor elements after a feedback coupling circuit time delay following propagation of a data input signal to the final output node, said negative feedback circuit means incorporating a data saver circuit means coupled to the final output node for saving the output data signal after turn off of the output pullup and pulldown transistor elements by the negative feedback coupling circuit means.

23. The IC of claim 18 wherein each of the first and second sequences further comprises:
  logic gate means having a first gate input coupled to the input node and a second gate input coupled in a feedback coupling circuit to the final output node of the IC, said logic gate means having an output coupled to the respective sequence of internal stages, said feedback coupling circuit including an invertor stage for negative feedback of a data output signal at the final output node of the IC, said logic gate means turning off the respective output pullup or pulldown transistor element after a feedback coupling circuit time delay following propagation of a data input signal to the final output node, said first and second sequences thereby holding off the output pullup and pulldown transistor elements after transmission of a data output signal.

24. The IC of claim 23 wherein the feedback coupling circuit comprises a data saver circuit means coupled to the final output node for saving the output data signal after turn off of the output pullup or pulldown transistor elements by the feedback coupling circuit and logic gate means.

25. The IC of claim 24 wherein the invertor stage and data saver circuit means of the feedback coupling circuit are provided by a pair of back to back cross coupled feedback invertor stages.

26. The IC of claim 18 further comprising:
  cutoff circuit means for cutting off the output pullup and pulldown transistor elements from the respective high and low potential power rails a time delay after transmission of an output data signal at the final output node.

27. The IC of claim 18 wherein the first and second sequences each comprise a cutoff delay stage means coupled in parallel with the respective output pullup or pulldown transistor element to the respective driver output node;
  wherein the IC further comprises an output pullup cutoff transistor element coupled in series with the output pullup transistor element, and an output pulldown cutoff transistor element coupled in series with the output pulldown transistor element;
  said first sequence cutoff delay stage means being coupled to the respective output pullup cutoff transistor element for cutting off the output pullup transistor element a predetermined delay period after propagation of a data input signal to the final output node, said second sequence cutoff delay stage means being coupled to the respective pulldown cutoff transistor element for cutting off the pulldown transistor element a predetermined delay period after propagation of a data input signal to the final output node.

28. The IC of claim 27 comprising a first data saver circuit coupled to the final output node for saving an output data signal during cutoff of the output pullup and pulldown transistor elements.

29. The IC of claim 16 wherein one of the first and second sequences comprises a different number of internal stages than the other sequence.

30. An integrated circuit having an input node for receiving input data signals of high and low potential, an output stage coupled between high and low potential power rails, said output stage having an output pullup transistor element coupled to the high potential power rail, an output pulldown transistor element coupled to the low potential power rail, and a final output node between the output pullup and pulldown transistor elements for transmitting output data signals of high and low potential, comprising:
  a relatively higher speed first signal propagation circuit path means including active transistor elements coupled between the input node and an output pullup driver node coupled to the output pullup transistor element and not the output pulldown transistor element for turning on the output pullup transistor element at relatively higher speed in response to a first data signal at the input node;
  a relatively slower speed second signal propagation circuit path means including active transistor elements coupled between the input node and an output pulldown driver node coupled to the output pulldown transistor element for turning off the output pulldown transistor element at relatively slower speed in response to said first input data signal at the input node;

output cutoff circuit means operatively coupled to the output pullup and pulldown transistor elements for cutting off the output pullup and pulldown transistor elements from the respective high and low potential power rails a time delay after transmission of an output data signal at the final output node;

and data saver circuit means coupled to the final output node for holding the output data signal during cutoff of the output pullup and pulldown transistor elements.

* * * * *

REEXAMINATION CERTIFICATE (1758th)

United States Patent [19]

Rogers

[11] B1 5,061,864

[45] Certificate Issued Jul. 21, 1992

[54] MONOPHASE LOGIC

[75] Inventor: Alan C. Rogers, South Portland, Me.

[73] Assignee: National Semiconductor Corporation

Reexamination Request:
No. 90/002,600, Feb. 14, 1992

Reexamination Certificate for:
Patent No.: 5,061,864
Issued: Oct. 29, 1991
Appl. No.: 540,214
Filed: Jun. 18, 1990

[51] Int. Cl.⁵ ................. H03K 19/003; H03K 19/017; H03K 17/04; H03K 17/687
[52] U.S. Cl. .................................... 307/443; 307/448; 307/449; 307/451; 307/542; 307/548; 307/550
[58] Field of Search ............... 307/443, 451, 448, 449, 307/548, 550, 542, 443, 451; 377/76

[56] References Cited

U.S. PATENT DOCUMENTS

| | | | |
|---|---|---|---|
| 4,638,187 | 1/1987 | Boler et al. | 307/451 |
| 4,785,203 | 11/1988 | Nakamura | 307/448 |
| 4,827,159 | 5/1989 | Naganuma | 307/443 |
| 4,866,308 | 9/1989 | Cecchi et al. | 307/451 |
| 4,885,485 | 12/1989 | Leake et al. | 307/542 |
| 4,959,561 | 9/1990 | McDermott et al. | 307/443 |
| 4,959,565 | 9/1990 | Knecht et al. | 307/542 |
| 4,977,341 | 12/1990 | Stein | 307/572 |
| 4,985,643 | 1/1991 | Proebsting | 307/443 |
| 4,992,676 | 2/1991 | Gerosa et al. | 307/443 |

*Primary Examiner*—John S. Heyman

[57] ABSTRACT

Intermediate path splitting circuit arrangements are coupled between the input node and output stage of an IC defining a plurality of different signal propagation paths. A relatively higher speed output pullup turn on signal progagation path is coupled between the input node and the output pullup transistor element for turning on the output pullup transistor element at relatively higher speed in response to a first input data signal. A relatively slower speed output pulldown turn off signal propagation path turns off the output pulldown transistor element at a relatively slower speed in response to the first data input signal. Similar circuit arrangements are provided for relatively high speed turn on of the pulldown transistor element and relatively low speed turn off of the pullup transistor element. Control of turn on and turn off of the respective output pullup and pulldown transistor elements is from separate output driver nodes for higher speed operation. The separate split paths are provided by sequences of internal stages with skewed conductance pullup and pulldown elements. A cuttoff circuit cuts off the output pullup and pulldown transistor elements a time delay after transmission of an output data signal to reduce simultaneous conduction. A data saver circuit coupled to the final output node saves the output data signal during cutoff. The high speed on logic signal propagation circuits are applicable in CMOS circuits and other logic families.

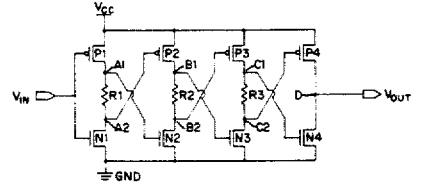

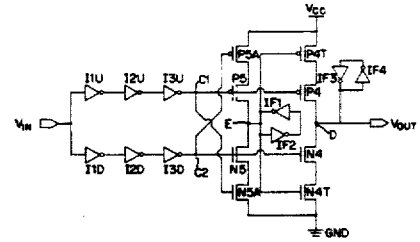

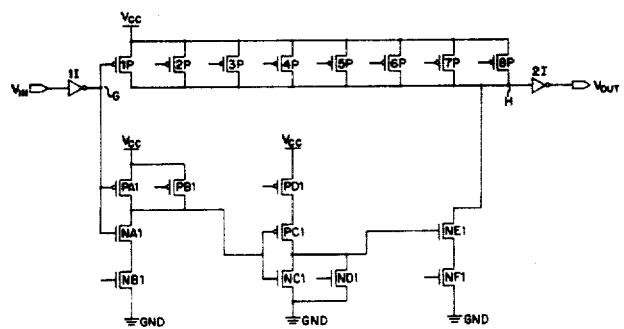

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1, 2 and 4–28 is confirmed.

Claims 3, 29 and 30 are determined to be patentable as amended.

3. The IC of claim 2 wherein the pullup and pulldown transistor elements are characterized as having a sourcing or sinking current [pat] *path* between source and drain nodes and a third control gate node for controlling the conducting state of the sourcing or sinking current path, and wherein the split path output node adjacent to the pullup transistor element of one internal stage is coupled to the control gate node of the pulldown transistor element of a next internal stage and wherein the split path output node adjacent to the pulldown transistor element of said one internal stage is coupled to the control gate node of the pullup transistor element of said next internal stage.

29. The IC of claim [16] *18* wherein one of the first and second sequences comprises a different number of internal stages than the other sequence.

30. An integrated circuit having an input node for receiving input data signals of high and low potential, an output stage coupled between high and low potential power rails, said output stage having an output pullup transistor element coupled to the high potential power rail, an output pulldown transistor element coupled to the low potential power rail, and a final output node between the output pullup and pulldown transistor elements for transmitting output data signals of high and low potential, comprising:

a relatively higher speed first signal propagation circuit path means including active transistor elements coupled between the input node and an output pullup driver node coupled to the output pullup transistor element and not the output pulldown transistor element for turning on the output pullup transistor element at relatively higher speed in response to a first data signal at the input node;

a relatively slower speed second signal propagation circuit path means including active transistor elements coupled between the input node and an output pulldown driver node coupled to the output pulldown transistor element for turning off the output pulldown transistor element at relatively slower speed in response to said first input data signal at the input node;

*a relatively higher speed third signal propagation circuit path means including active transistor elements coupled between the input node and an output pulldown driver node coupled to the output pulldown transistor element and not the output pullup transistor element for turning on the output pulldown transistor element at relatively higher speed in response to a second data signal at the input node;*

*a relatively slower speed fourth signal propagation circuit path means including active transistor elements coupled between the input node and an output pullup driver node coupled to the output pullup transistor element for turning off the output pullup transistor element at relatively slower speed in response to said second input data signal at the input node;* output cutoff circuit means operatively coupled to the output pullup and pulldown transistor elements for cutting off the output pullup and pulldown transistor elements from the respective high and low potential power rails a time delay after transmission of an output data signal at the final output node;

and data saver circuit means coupled to the final output node for holding the output data signal during cutoff of the output pullup and pulldown transistor elements.

* * * * *